United States Patent
Doktar et al.

(10) Patent No.: US 8,350,506 B2
(45) Date of Patent: Jan. 8, 2013

(54) FREQUENCY CONVERTER START-UP

(75) Inventors: Andreas Doktar, Vaasa (FI); Stefan Strandberg, Vörå (FI); Jaakko Ollila, Pirkkala (FI)

(73) Assignee: Vacon Oyj, Vaasa (FI)

( * ) Notice: Subject to any disclaimer, the term of this patent is extended or adjusted under 35 U.S.C. 154(b) by 383 days.

(21) Appl. No.: 12/752,495

(22) Filed: Apr. 1, 2010

(65) Prior Publication Data
US 2010/0253256 A1    Oct. 7, 2010

(30) Foreign Application Priority Data
Apr. 2, 2009 (FI) .................................... 20095361

(51) Int. Cl.
*H02P 6/20* (2006.01)
(52) U.S. Cl. ................... 318/400.11; 318/431
(58) Field of Classification Search ............ 318/400.11, 318/430–434
See application file for complete search history.

(56) References Cited

U.S. PATENT DOCUMENTS

| | | | | | |
|---|---|---|---|---|---|
| 4,392,099 | A | * | 7/1983 | Kuniyoshi | 318/797 |
| 4,734,634 | A | * | 3/1988 | Kito et al. | 318/778 |
| 4,743,815 | A | * | 5/1988 | Gee et al. | 318/400.11 |
| 4,746,850 | A | * | 5/1988 | Abbondanti | 318/723 |
| 5,408,150 | A | | 4/1995 | Wilcox | |
| 5,483,140 | A | * | 1/1996 | Hess et al. | 318/802 |
| 5,506,484 | A | * | 4/1996 | Munro et al. | 318/599 |
| 6,285,146 | B1 | * | 9/2001 | Harlan | 318/400.04 |
| 7,095,204 | B2 | * | 8/2006 | Lee et al. | 318/700 |
| 7,948,204 | B2 | * | 5/2011 | Palma et al. | 318/798 |
| 2004/0120172 | A1 | | 6/2004 | Heikkila et al. | |
| 2005/0152165 | A1 | | 7/2005 | Virolainen et al. | |
| 2005/0225374 | A1 | | 10/2005 | Ribarich et al. | |
| 2007/0001635 | A1 | | 1/2007 | Ho | |
| 2008/0150515 | A1 | | 6/2008 | Ollila et al. | |

(Continued)

FOREIGN PATENT DOCUMENTS

EP    0994561 A2    4/2000

(Continued)

OTHER PUBLICATIONS

Borisavljevic et al, "Fan Drive Starting into Naturally Rotating Load by Sinusoidal Sensorless Permanent Magnet Motor Control," IEEE, 2006, pp. 1190-1198.

(Continued)

*Primary Examiner* — Bentsu Ro
(74) *Attorney, Agent, or Firm* — Birch, Stewart, Kolasch & Birch, LLP

(57) ABSTRACT

Method and apparatus to start a frequency converter equipped with a direct current intermediate circuit, particularly when a permanent magnet motor whose rotor is rotating at the start-up time is connected to it, wherein the frequency converter has a network bridge (10) and load bridge (11), and the load bridge has controllable power semiconductor switches of the upper and lower branch ($V_1$-$V_6$) and parallel connected zero diodes ($D_1$-$D_6$), and a direct current intermediate circuit between them, and the said frequency converter uses a current transducer placed in the direct current intermediate circuit, and the analogue current signal composed by it features samples of the measured output currents, and the diverter switches of the frequency converter's upper branch are controlled using the bootstrap method, wherein start-up is initiated by controlling the controllable power semiconductor switch of the lower branch of at least one output phase to a conductive state for one or several periods of time, preferably of approximately 200 µs, at a time.

20 Claims, 2 Drawing Sheets

U.S. PATENT DOCUMENTS

2011/0050140 A1* 3/2011 Sakai et al. ............. 318/400.36

FOREIGN PATENT DOCUMENTS

| FI | 113106 B | 2/2004 |
| FI | 116337 B | 10/2005 |
| FI | 119493 B | 11/2008 |
| JP | 10-56794 A | 2/1998 |
| JP | 2001-275366 A | 10/2001 |
| JP | 2003-61385 A | 2/2003 |
| JP | 2005-65410 A | 3/2005 |
| JP | 2007-236015 A | 9/2007 |

OTHER PUBLICATIONS

Lorenz et al., "Design Proposal for Low Power Drives", Proceedings of PCIM Europe 2001, Jun. 2001, XP002595783, 7 pages.

* cited by examiner

FREQUENCY CONVERTER START-UP

FIELD OF TECHNOLOGY

This invention relates to a method and apparatus for starting a frequency converter when a permanent magnet motor whose rotor is rotating during the start-up is connected to it. The method and equipment particularly relate to a frequency converter whose current transducer is located in the DC intermediate circuit and whose driving power to the diverter switches of the load bridge upper branch is input with the so-called bootstrap method.

DESCRIPTION OF THE PROBLEM AND PRIOR ART

Especially with low-power frequency converters, the competitive situation in the market makes it a necessity to seek the most simple and cost-efficient technical solutions possible that will achieve the required performance. For example, motor current can be measured using only one current transducer located in the DC intermediate circuit instead of three current transformers placed in the output phases in accordance with FI 116337 or FI 119473.

Similarly, the driving power of controllable diverter switches of the upper branch can be input without galvanic separation instead of galvanically separated power input circuits from the lower branch potential using a so-called bootstrap coupling, which is known, e.g., in U.S. Pat. No. 5,408,150. Motors equipped with a rotor with permanent magnets have recently become more common due to their low costs in low-power applications and accurately adjustable rotation speed. (A permanent magnet machine is a synchronous machine by nature, with no slip, unlike the most common motor type, the short circuit motor.) A frequency converter is known to be the most advantageous way of adjusting the speed of rotation.

In some cases, the motor can rotate even if the coupled frequency converter is in the stopped state. For instance, in an air conditioning application, a weak gravitational air flow can result in a force that rotates a fan located in an air duct. In the same way as several motors rotate a long conveyor belt, a motor whose supplying frequency converter has been stopped for some reason rotates. The terminal voltage of a permanent magnet motor is known to be directly proportional to the speed of rotation.

When the driving power to the diverter switches of the frequency converter's upper branch diverter switches is supplied with the bootstrap method, operation must be started by first switching the lower branch diverter switch conductive to supply control voltage to the upper branch. This may result in a short circuit between the phases when the permanent magnet motor coupled to the frequency converter is rotating. When the motor's current is measured using only one transducer located in the DC intermediate circuit, this kind of a short-circuit current is not necessarily observed at all, which might result in damage to the device.

Start-up of a frequency converter to a rotating motor usually requires special measures to prevent an uncontrolled overload current pulse. Patent FI 113106, for instance, discloses a method wherein phase voltages are determined prior to start-up using current measurement, making it possible to synchronize the output voltages of the frequency converter with the voltages of the rotating motor. However, the method requires measuring the current in at least two output phases, so it is not intended for a frequency converter with only one current measurement in the DC intermediate circuit. A solution is known wherein output voltage measurement circuits have been included in the frequency converter, naturally incurring additional costs.

SUMMARY OF THE INVENTION

The purpose of this invention is to achieve a novel start-up method of a frequency converter that avoids the disadvantages mentioned above and enables the safe start-up of a frequency converter equipped with one DC current transducer and upper branch bootstrap driving power supply to a rotating permanent magnet motor. This purpose is achieved by the method and apparatus according to the invention, characterized by the characterizing parts of the independent claims. Other preferred embodiments of the invention are covered by the dependent claims.

In the method of the invention, one diverter switch in the lower branch of the load bridge is controlled to a conductive state for a short time, such as for 200 µs. The time is so short that the short-circuit current of a possibly rotating permanent magnet motor will not have time to increase to a dangerous level, yet long enough in terms of current measurement. When the diverter switch is returned to a non-conductive state, any short-circuit current, which is inductive as is known, will continue its passage via the corresponding zero diode of the upper branch and return to the motor through the capacitor of the DC intermediate circuit and zero diodes of other phases in the lower branch. Therefore, the path of current goes via the current transducer placed in the DC intermediate circuit, from which the control system of the device receives information about a short-circuit current, which is also an indication of the motor coupled to the frequency converter rotating.

According to the invention, the above-mentioned control pulses are continued for the desired duration, which yields information also on the motor's speed of rotation; when the phase current is positive, current pulses are flowing, whereas there are no current pulses flowing during the negative alternation. Correspondingly, when control pulses are issued to every phase, or at least two phases, this yields information on the phase sequence, i.e., the direction of rotation.

The invention makes it possible to safely start a rotating permanent magnet motor with a frequency converter whose current measurement and diverter switch driving power supply solutions are technically limited due to cost-related reasons.

BRIEF DESCRIPTION OF THE DRAWINGS

Below the invention appears a more detailed explanation using examples with references to the enclosed figures, wherein.

DETAILED DESCRIPTION OF THE INVENTION

Figure 1:
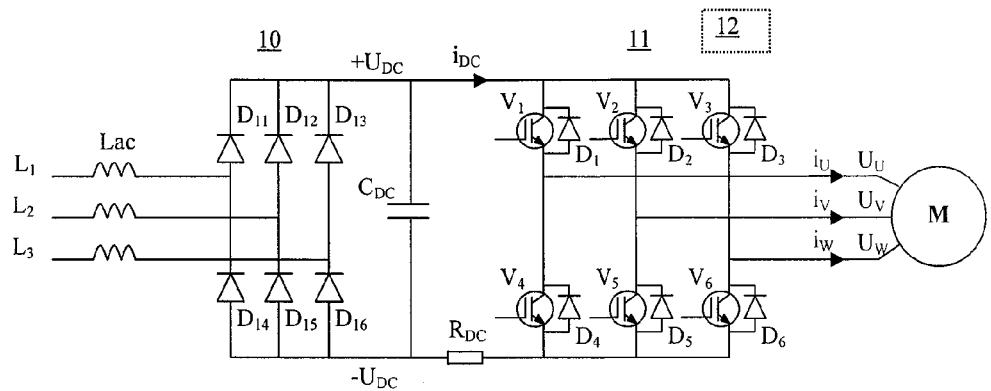
FIG. 1 presents the main circuit of frequency converter use and current transducer placed in the intermediate circuit.

FIG. 1 presents a known three-phase PWM frequency converter main circuit, with a power line, whose connections are $L_1$-$L_3$, current-filtering AC resistors Lac (instead of which a restrictor placed in the DC intermediate circuit is commonly used, or particularly in low-power devices the restrictor may be omitted altogether), a network bridge 10 comprising of diodes $D_{11}$-$D_{16}$ to rectify the three-phase alternating current of the power line into the direct current of the direct current intermediate circuit, filtered with the capacitor $C_{DC}$, a load bridge 11 comprising of a phase switch realized with power semiconductors that converts the direct current $U_{DC}$ of the intermediate circuit into a three-phase output voltage $U_U$, $U_V$, $U_W$, and control unit 12. The phase switches $V_1$-$V_6$ of the load bridge 11 comprise of controllable upper- and lower-branch power semiconductor switches, preferably IGBTs $V_1$-$V_6$ and zero diodes $D_1$-$D_6$ connected parallel to them. The phase switches $V_1$-$V_6$ connect the output phase either to the +$U_{DC}$ (top position) or –$U_{DC}$ (low position) rail. The control pulses of the power semiconductor switches $V_1$-$V_6$ are formed in the so-called modulator of the control unit 12.

This invention relates to a system wherein power of motor M is measured with a current transducer $R_{DC}$ placed in the DC intermediate circuit, such as shunt resistor $R_{DC}$, which may be located in the –$U_{DC}$ branch as presented in the figure, or alternatively in the +$U_{DC}$ branch or in series with filter capacitor $C_{DC}$ of the DC intermediate circuit. Current measurement according to the figure is known to yield information on motor currents according to the position of the phase switches $V_1$-$V_6$. Table 1 presents the dependencies between all of the different switch positions and phase currents seen in the $i_{DC}$ signal (the positive direction of the currents is configured according to FIG. 1 towards the motor M, position 0 of phase switches U, V, W means that the IGBT of the phase switch lower branch has been controlled to a conductive state, and position 1 correspondingly means upper branch control):

TABLE 1

| UVW | $i_{DC}$ |
|---|---|
| 000 | 0 |
| 100 | $i_U$ |
| 010 | $i_V$ |
| 001 | $i_W$ |
| 110 | –$i_W$ |
| 011 | –$i_U$ |
| 101 | –$i_V$ |
| 111 | 0 |

Figure 2:
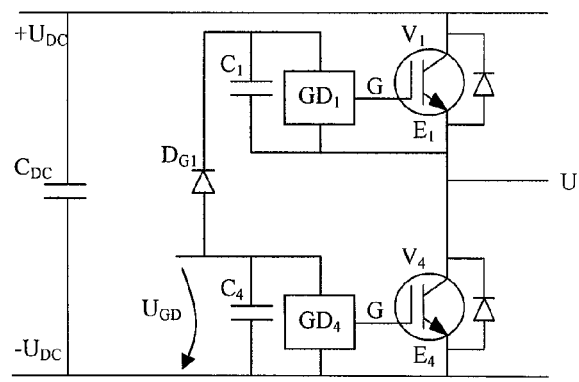
FIG. 2 presents the diverter switch driving power supply solution.

FIG. 2 presents a known so-called bootstrap connection, which is a preferred way of supplying the driving power required by the upper branch power semiconductor switch ($V_1$). In accordance with the bootstrap idea, when lower branch diverter switch $V_4$ conducts, the emitter potential $E_1$ of switch $V_1$ of the upper branch is close to the –$U_{DC}$ potential, in which case the upper branch control circuit $GD_1$ auxiliary voltage filter capacitor $C_1$ charges through the bootstrap diode $D_{G1}$ to nearly the same voltage $U_{GD}$ used for supplying the lower branch control circuit $GD_4$. Full controllability of the phase switch, i.e., the possibility to control both the upper and lower branch power semiconductor switches conductive therefore requires that the control start from the lower branch and that the switching frequency, i.e., the frequency with which the upper and lower branch control pulses alternate, is high enough for the voltage in the upper branch capacitor $C_1$ to remain sufficient at all times.

Figure 3:
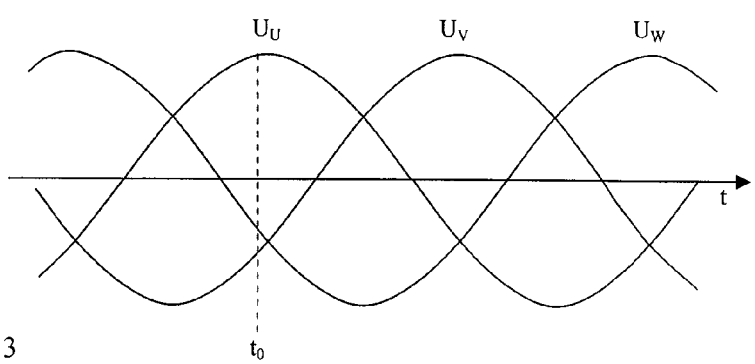
FIG. 3 presents the voltages of a three-phase system.
Figure 4:
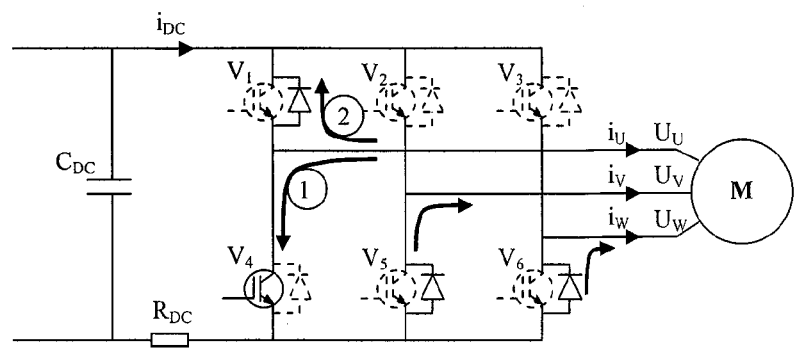
FIG. 4 presents the path of short-circuit current in a frequency converter.
Figure 5:
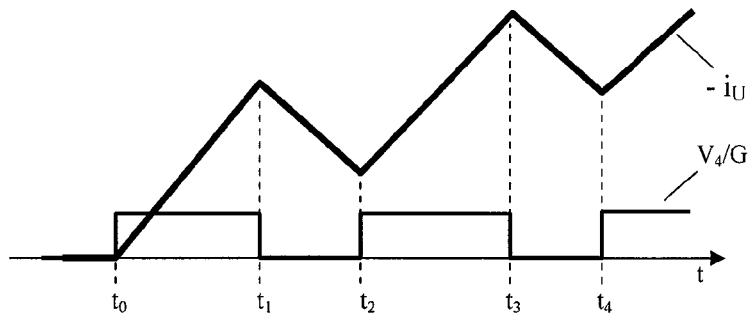
FIG. 5 presents short-circuit current and lower branch switch controls.

FIGS. 3-5 are related to illustrating the basics of the method of the invention. FIG. 3 presents a three-phase sine curve, such as connection voltage $U_U$, $U_V$, $U_W$ of the rotating permanent magnet motor when the connected frequency converter is in the stopped state.

Let us assume that control of the frequency converter according to the invention begins at moment $t_0$, when the voltage of the U phase is positive and voltages of the other phases are negative. Let us further assume, as described above, that the lower branch diverter switch $V_4$ of the U phase is first controlled to be conductive. Therefore, the short circuit presented in FIG. 4 is established through all conductive lower branch switches $V_4$-$V_6$. According to FIG. 4, the short-circuit current flows through the U phase lower branch IGBT's $V_4$ (current path 1) and zero diodes $D_5$-$D_6$ of the lower branch of other phases. The components involved in the flow of the current have been drawn with a continuous line in the figure to illustrate the situation; those not involved are shown with a broken line. In FIG. 5, which presents the U phase lower branch diverter switch $V_4$ control signal $V_4$/G and U phase current negation –$i_U$, the same situation is portrayed by the time interval $t_0$-$t_1$. It is easy to see in FIG. 4 that as the motor current flows only via the lower branch, current transducer $R_{DC}$, does not detect any current flow.

Let us further assume that control of the $V_4$ switch is stopped at moment $t_1$ according to FIG. 5, wherein the inductive short-circuit current of the U phase turns to flow via the upper branch zero diode $D_1$ (current path 2 in FIG. 4). The currents of the other phases continue to flow along the previous path through the lower branches as the zero diodes $D_5$-$D_6$ remain conductive and the voltages of these phases remain negative. As the U phase is now in a different position from the other phases, its current is shown in the current transducer $R_{DC}$ according to Table 1 (U V W=1 0 0, so $i_{DC}$=$i_U$). The situation continues during the time interval $t_1$-$t_2$ presented in FIG. 5, wherein the current supplied by the motor M decreases as inductive energy is discharged into the intermediate circuit.

At moment $t_2$, the U phase lower branch switch $V_4$ is returned to a conductive state, again forming a short-circuit due to which the motor's current begins to increase again. The operation continues in this way for as long as desired. As mentioned above, the DC intermediate circuit current transducer $R_{DC}$ sees a sample of the motor's current only when the phase switches are in different positions. In order to achieve a coherent view of the output currents, the frequency converter's control unit usually interpolates the results between samples.

Figure 6:
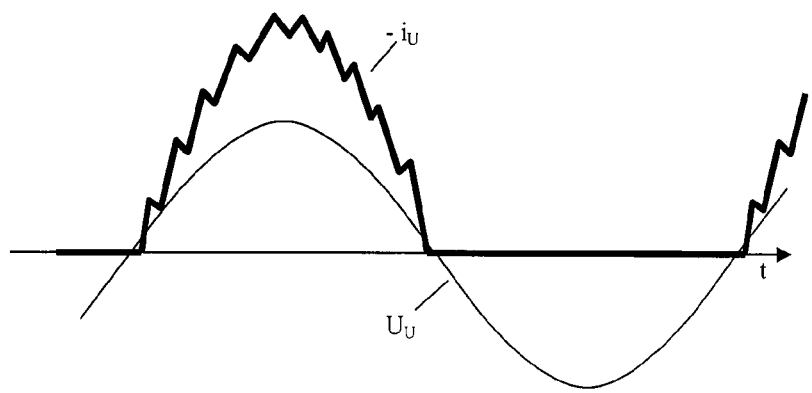
FIG. 6 presents short-circuit current during the entire phase.

FIG. 6 presents the flow of the phase current explained above during a longer period of time. In the figure, $U_U$ is the virtual U phase voltage of the permanent magnet motor M (illustrating the internal electromotive force of the motor; the actual terminal voltage during the operation of the frequency converter is known to be pulse-like), and –$i_U$ is the negation of the same phase current. According to the invention, the lower branch control pulses are similar in length in connection with start-up and long enough for current to clearly flow, yet not long enough for the current to reach dangerous levels during a single pulse. As the terminal voltage of the permanent magnet motor M is proportional to the speed of rotation, it may be advantageous to change the length of the pulse according to the measured current. This can be realized, e.g., by beginning with a short pulse, such as approximately 200 μs, and if the measured current is too low to make accurate conclusions, the length of the pulse is increased as necessary. This way, the higher the phase voltage, the higher the current increases during the short circuits. Furthermore, if the phase voltage is negative, no short-circuit current flows in the first place. Thus, when the lower branch of a single phase is initially controlled according to the invention, the measured phase current also represents information of the positive alternation of the phase voltage.

Information about phase current and phase voltage achieved according to the invention can be utilized in various ways. For instance, the start-up of the frequency converter can be prevented completely when the motor is rotating. It is also possible, during a few motor rotation cycles, to repeat the above function, e.g., in two phases, which provides information on the sequence of these phase voltages, and combined with the measured alternation time, this provides information on the direction and speed of rotation. Based on this information, it is possible to start the frequency converter directly to a rotating motor (known as "flying start").

To those skilled in the art, it is obvious that the various embodiments of the invention are not exclusively limited to the examples provided but that they may vary within the limits of the patent claims presented below.

The invention claimed is:

1. A method to start a frequency converter equipped with a direct current intermediate circuit when a permanent magnet motor whose rotor is rotating at a start-up time is connected to the frequency converter,
wherein the frequency converter has a network bridge (10) and load bridge (11), and the load bridge (11) has an upper branch with controllable power semiconductor switches ($V_1$-$V_3$) and parallel connected zero diodes ($D_1$-$D_3$) a lower branch with controllable power semiconductor switches ($V_4$-$V_6$) and parallel connected zero diodes ($D_4$-$D_6$), and a direct current intermediate circuit between the network bridge (10) and load bridge (11),
and the said frequency converter uses a current transducer ($R_{DC}$) placed in the direct current intermediate circuit, and an analogue current signal composed by the frequency convertor features samples of measured output currents, and
the switches ($V_1$-$V_3$) of the upper branch of the frequency converter converter are controlled using a bootstrap method,
the method comprising:
initiating the start-up of the frequency converter by controlling the controllable power semiconductor switch of the lower branch of one output phase to a conductive state for one or several periods of time.

2. The method according to claim 1, further comprising:
preventing the start-up of the frequency converter when the current transducer ($R_{DC}$) detects that the output current deviates from zero in any of the output phases during the time between the conductive controls.

3. The method according to claim 1, further comprising:
continuing the conductive controls until there is no current flow when the current transducer ($R_{DC}$) detects that the output current deviates from zero in any of the output phases during the time between the conductive controls,
wherein each of the several periods of time is approximately 200 µs.

4. The method according to claim 3, further comprising:
using the time during which flow of current is detected as an indicator of a positive alternation of a phase voltage of the permanent magnet motor.

5. The method according to claim 3, further comprising:
controlling of the controllable power semiconductor switches of the lower branch in at least two phases.

6. The method according to claim 1, further comprising:
using the time during which flow of the current is detected as an indicator of positive alternation of a phase voltage of the permanent magnet motor.

7. The method according to claim 6, further comprising:
controlling of the controllable power semiconductor switches of the lower branch in at least two phases.

8. The method according to claim 1, further comprising:
controlling the controllable power semiconductor switches of the lower branch in at least two phases.

9. The method according to claim 8, further comprising:
using the times during which the output current is detected to flow in at least two phases as an indicator of a phase sequence of the permanent magnet motor.

10. The method according to claim 1, wherein the current transducer ($R_{DC}$) in the direct current intermediate circuit is arranged in series directly between an upper branch of the network bridge (10) and the upper branch of the load bridge (11).

11. An apparatus to start a frequency converter equipped with a direct current intermediate circuit when a permanent magnet motor whose rotor is rotating at a start-up time is connected to the frequency converter,
wherein the frequency converter has a control unit, network bridge (10) and load bridge (11), and the load bridge (11) has an upper branch with controllable power semiconductor switches ($V_1$-$V_3$) and parallel connected zero diodes ($D_1$-$D_3$), a lower branch with controllable power semiconductor switches ($V_4$-$V_6$) and parallel diodes ($D_4$-$D_6$), and a direct current intermediate circuit between the network bridge (10) and the load bridge (11),
and the said frequency converter has a current transducer ($R_{DC}$) placed in the direct current intermediate circuit, and an analogue current signal composed by the frequency converter features samples of measured output currents, and
the said control unit is adapted to control the switches (V1-V3) of the upper branch of the frequency converter using a bootstrap method,
wherein the control unit is adapted to initiate the start-up by controlling the controllable power semiconductor switch of the lower branch of one output phase to a conductive state for one or several periods of time.

12. The apparatus according to claim 11, wherein the control unit is adapted to prevent the start-up of the frequency converter when the current transducer detects that the output current deviates from zero in any of the output phases during the time between the conductive controls.

13. The apparatus according to claim 11, wherein the control unit is adapted to continue the conductive controls until there is no current flow when the current transducer detecting that the output current deviates from zero in any of the output phases during the time between the conductive controls,
wherein each of the several periods of time is approximately 200 µs.

14. The apparatus according to claim 13, wherein the control unit is adapted to use the time during which flow of current is detected as an indicator of a positive alternation of a phase voltage of the permanent magnet motor.

15. The apparatus according to claim 13, wherein the control unit is adapted to control the controllable power semiconductor switches of the lower branch in at least two phases.

16. The apparatus according to claim 11, wherein the control unit is adapted to use the time during which flow of current is detected as an indicator of a positive alternation of a phase voltage of the permanent magnet motor.

17. The apparatus according to claim 16, wherein the control unit is adapted to control the controllable power semiconductor switches in at least two phases.

18. The apparatus according to claim 11, the wherein the control unit is adapted to control the controllable power semiconductor switches of the lower branch in at least two phases.

19. The apparatus according to claim 18, wherein the control unit is adapted to use the times during which the output current is detected to flow in at the least two phases as an indicator of a phase sequence of the permanent magnet motor.

20. The apparatus according to claim 11, wherein the current transducer ($R_{DC}$) in the direct current intermediate circuit is arranged in series directly between an upper branch of the network bridge (10) and the upper branch of the load bridge (11).

* * * * *